United States Patent
Lu et al.

(10) Patent No.: US 11,665,893 B2
(45) Date of Patent: May 30, 2023

(54) METHODS AND APPARATUSES HAVING STRINGS OF MEMORY CELLS INCLUDING A METAL SOURCE

(71) Applicant: Micron Technology, Inc., Boise, ID (US)

(72) Inventors: Zhenyu Lu, Boise, ID (US); Roger W. Lindsay, Boise, ID (US); Andrew Bicksler, Nampa, ID (US); Yongjun Jeff Hu, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/255,967

(22) Filed: Sep. 2, 2016

(65) Prior Publication Data

US 2016/0372479 A1    Dec. 22, 2016

Related U.S. Application Data

(62) Division of application No. 14/069,553, filed on Nov. 1, 2013, now Pat. No. 9,437,604.

(51) Int. Cl.
*H01L 27/11556* (2017.01)
*H01L 29/66* (2006.01)
*H01L 29/792* (2006.01)
*H01L 27/11524* (2017.01)
(Continued)

(52) U.S. Cl.
CPC .... *H01L 27/11556* (2013.01); *H01L 23/5283* (2013.01); *H01L 27/11524* (2013.01); *H01L 29/456* (2013.01); *H01L 29/66825* (2013.01); *H01L 29/7926* (2013.01)

(58) Field of Classification Search
CPC ......... H01L 27/11556; H01L 27/11524; H01L 29/66825; H01L 29/456; H01L 29/7926
See application file for complete search history.

(56) References Cited

U.S. PATENT DOCUMENTS

| 5,053,840 A | 10/1991 | Yoshikawa |
|---|---|---|
| 5,838,039 A | 11/1998 | Sato et al. |
| 6,159,797 A | 12/2000 | Lee |

(Continued)

FOREIGN PATENT DOCUMENTS

| CN | 1401140 A | 3/2003 |
|---|---|---|
| CN | 1791974 A | 6/2006 |

(Continued)

OTHER PUBLICATIONS

US 9,754,952 B2, 09/2017, Dennison et al. (withdrawn)
(Continued)

*Primary Examiner* — Vongsavanh Sengdara
(74) *Attorney, Agent, or Firm* — Schwegman Lundberg & Woessner, P.A.

(57) ABSTRACT

Methods for forming a string of memory cells, an apparatus having a string of memory cells, and a system are disclosed. A method for forming the string of memory cells comprises forming a metal silicide source material over a substrate. The metal silicide source material is doped. A vertical string of memory cells is formed over the metal silicide source material. A semiconductor material is formed vertically and adjacent to the vertical string of memory cells and coupled to the metal silicide source material.

16 Claims, 6 Drawing Sheets

(51) Int. Cl.
*H01L 23/528* (2006.01)
*H01L 29/45* (2006.01)

(56) References Cited

U.S. PATENT DOCUMENTS

| | | |
|---|---|---|
| 6,445,029 B1 | 9/2002 | Lam et al. |
| 6,541,835 B1* | 4/2003 | Pettersson ............ H01L 25/043 |
| | | 257/429 |
| 6,583,009 B1 | 6/2003 | Hui et al. |
| 7,369,436 B2 | 5/2008 | Forbes |
| 7,682,902 B2 | 3/2010 | Hsiao et al. |
| 7,910,446 B2 | 3/2011 | Ma et al. |
| 8,124,478 B2 | 2/2012 | Park et al. |
| 8,187,936 B2 | 5/2012 | Alsmeier et al. |
| 8,258,034 B2 | 9/2012 | Ramaswamy et al. |
| 8,581,321 B2 | 11/2013 | Son et al. |
| 8,680,605 B2 | 3/2014 | Jeon et al. |
| 8,946,807 B2 | 2/2015 | Hopkins et al. |
| 9,171,863 B2 | 10/2015 | Wang |
| 9,184,175 B2 | 11/2015 | Dennison et al. |
| 9,230,986 B2 | 1/2016 | Hopkins et al. |
| 9,231,086 B2 | 1/2016 | Khoueir et al. |
| 9,276,011 B2 | 3/2016 | Simsek-Ege et al. |
| 9,431,410 B2 | 8/2016 | Sun et al. |
| 9,437,604 B2 | 9/2016 | Lu et al. |
| 9,608,000 B2 | 3/2017 | Hopkins et al. |
| 9,627,213 B2 | 4/2017 | Hee et al. |
| 9,773,841 B2 | 9/2017 | Simsek-Ege et al. |
| 9,793,282 B2 | 10/2017 | Dennison et al. |
| 9,991,273 B2 | 6/2018 | Dennison et al. |
| 10,170,639 B2 | 1/2019 | Hopkins et al. |
| 10,217,799 B2 | 2/2019 | Simsek-Ege et al. |
| 10,529,776 B2 | 1/2020 | Simsek-Ege et al. |
| 2003/0155582 A1 | 8/2003 | Mahajani et al. |
| 2005/0006697 A1 | 1/2005 | Hsieh |
| 2005/0026382 A1 | 2/2005 | Akatsu et al. |
| 2005/0133851 A1 | 6/2005 | Forbes |
| 2005/0224346 A1 | 10/2005 | Holm-kennedy |
| 2006/0134846 A1 | 6/2006 | Wang |
| 2006/0237768 A1 | 10/2006 | Forbes et al. |
| 2006/0258091 A1 | 11/2006 | Deloach |
| 2007/0047304 A1 | 3/2007 | Lee et al. |
| 2007/0158736 A1 | 7/2007 | Arai et al. |
| 2008/0012061 A1 | 1/2008 | Ichige et al. |
| 2008/0017911 A1* | 1/2008 | Akahori ............ H01L 29/42336 |
| | | 438/257 |
| 2008/0064225 A1 | 3/2008 | Yau et al. |
| 2008/0067583 A1* | 3/2008 | Kidoh ................ H01L 29/66825 |
| | | 257/326 |
| 2008/0173928 A1 | 7/2008 | Arai et al. |
| 2008/0253183 A1 | 10/2008 | Mizukami et al. |
| 2008/0277720 A1 | 11/2008 | Youn et al. |
| 2008/0315330 A1 | 12/2008 | Walker et al. |
| 2009/0026460 A1 | 1/2009 | Ou et al. |
| 2009/0009601 A1 | 4/2009 | Hyun |
| 2009/0121271 A1 | 5/2009 | Son et al. |
| 2009/0184360 A1 | 7/2009 | Jin |
| 2009/0230458 A1 | 9/2009 | Ishiduki et al. |
| 2009/0230459 A1 | 9/2009 | Kito et al. |
| 2009/0262295 A1* | 10/2009 | Hong ................ C09K 19/3402 |
| | | 252/299.61 |
| 2009/0283813 A1 | 11/2009 | Ishii et al. |
| 2009/0283819 A1 | 11/2009 | Ishikawa et al. |
| 2009/0290412 A1* | 11/2009 | Mouli ................ G11C 13/003 |
| | | 438/129 |
| 2010/0003795 A1 | 1/2010 | Park et al. |
| 2010/0020608 A1 | 1/2010 | Kamigaichi et al. |
| 2010/0039865 A1* | 2/2010 | Kidoh ................ H01L 27/11582 |
| | | 365/185.23 |
| 2010/0123180 A1 | 5/2010 | Takano et al. |
| 2010/0163968 A1 | 7/2010 | Kim et al. |
| 2010/0181612 A1 | 7/2010 | Kito et al. |
| 2010/0187592 A1 | 7/2010 | Chen et al. |
| 2010/0200908 A1 | 8/2010 | Lee et al. |
| 2010/0207193 A1 | 8/2010 | Tanaka et al. |
| 2010/0240205 A1* | 9/2010 | Son ..................... H01L 29/7827 |
| | | 438/588 |
| 2010/0295120 A1 | 11/2010 | Sandhu |
| 2010/0323505 A1 | 12/2010 | Ishikawa et al. |
| 2011/0002178 A1* | 1/2011 | Hwang ............... H01L 29/6656 |
| | | 257/314 |
| 2011/0024818 A1* | 2/2011 | Ahn ..................... H01L 29/7881 |
| | | 257/314 |
| 2011/0049608 A1 | 3/2011 | Kidoh et al. |
| 2011/0065270 A1 | 3/2011 | Shim et al. |
| 2011/0073866 A1 | 3/2011 | Kim et al. |
| 2011/0147823 A1 | 6/2011 | Kuk et al. |
| 2011/0201167 A1 | 8/2011 | Satonaka et al. |
| 2011/0220987 A1 | 9/2011 | Tanaka et al. |
| 2011/0233646 A1 | 9/2011 | Mizushima et al. |
| 2011/0248327 A1 | 10/2011 | Son et al. |
| 2011/0248334 A1 | 10/2011 | Sandhu et al. |
| 2011/0294290 A1 | 12/2011 | Nakanishi |
| 2011/0303971 A1* | 12/2011 | Lee ..................... H01L 27/11551 |
| | | 257/324 |
| 2012/0001247 A1 | 1/2012 | Alsmeier |
| 2012/0001249 A1 | 1/2012 | Alsmeier et al. |
| 2012/0001252 A1 | 1/2012 | Alsmeier et al. |
| 2012/0058629 A1 | 3/2012 | You et al. |
| 2012/0068242 A1 | 3/2012 | Shin et al. |
| 2012/0077320 A1 | 3/2012 | Shim et al. |
| 2012/0112264 A1 | 5/2012 | Lee et al. |
| 2012/0132981 A1 | 5/2012 | Imamura et al. |
| 2012/0217564 A1 | 8/2012 | Tang et al. |
| 2012/0231593 A1 | 9/2012 | Joo et al. |
| 2012/0256247 A1* | 10/2012 | Alsmeier .......... H01L 27/11582 |
| | | 257/E21.422 |
| 2012/0273870 A1 | 11/2012 | Liu |
| 2012/0326221 A1 | 12/2012 | Sinha |
| 2013/0034594 A1 | 2/2013 | Monzyk et al. |
| 2013/0049095 A1 | 2/2013 | Whang et al. |
| 2013/0077380 A1* | 3/2013 | Sakamoto .......... G11C 13/0069 |
| | | 365/148 |
| 2013/0089974 A1 | 4/2013 | Lee et al. |
| 2013/0119452 A1 | 5/2013 | Endoh et al. |
| 2013/0171788 A1 | 7/2013 | Yang et al. |
| 2013/0248974 A1 | 9/2013 | Alsmeier et al. |
| 2013/0270625 A1 | 10/2013 | Jang et al. |
| 2013/0307053 A1 | 11/2013 | Polishchuk et al. |
| 2013/0322174 A1 | 12/2013 | Li et al. |
| 2014/0131784 A1 | 5/2014 | Davis |
| 2014/0167131 A1* | 6/2014 | Lu ..................... H01L 29/7889 |
| | | 438/257 |
| 2014/0203344 A1 | 7/2014 | Hopkins et al. |
| 2014/0231954 A1 | 8/2014 | Lue |
| 2014/0264353 A1 | 9/2014 | Lai |
| 2014/0264532 A1 | 9/2014 | Dennison et al. |
| 2014/0264533 A1 | 9/2014 | Simsek-ege et al. |
| 2014/0264547 A1* | 9/2014 | Kawai ............... H01L 29/66833 |
| | | 438/287 |
| 2014/0334230 A1 | 11/2014 | Kwon |
| 2015/0123188 A1 | 5/2015 | Lu et al. |
| 2015/0123189 A1 | 5/2015 | Sun et al. |
| 2015/0140797 A1 | 5/2015 | Hopkins et al. |
| 2016/0049417 A1 | 2/2016 | Dennison et al. |
| 2016/0093626 A1 | 3/2016 | Izumi et al. |
| 2016/0133752 A1 | 5/2016 | Hopkins et al. |
| 2016/0181323 A1 | 6/2016 | Simsek-ege et al. |
| 2016/0351580 A1 | 12/2016 | Hopkins et al. |
| 2017/0200801 A1 | 7/2017 | Hopkins et al. |
| 2017/0352704 A1 | 12/2017 | Simsek-ege et al. |
| 2017/0365615 A1 | 12/2017 | Dennison et al. |
| 2018/0350827 A1 | 12/2018 | Dennison et al. |
| 2019/0273120 A1 | 9/2019 | Simsek-ege et al. |
| 2020/0144331 A1 | 5/2020 | Simsek-ege et al. |

FOREIGN PATENT DOCUMENTS

| | | |
|---|---|---|
| CN | 101118910 A | 2/2008 |
| CN | 101211970 A | 7/2008 |
| CN | 101223640 A | 7/2008 |
| CN | 101292351 A | 10/2008 |
| CN | 101364614 A | 2/2009 |

(56) References Cited

FOREIGN PATENT DOCUMENTS

| | | | |
|---|---|---|---|
| CN | 101512729 A | 8/2009 |
| CN | 101847602 A | 9/2010 |
| CN | 105027285 A | 11/2015 |
| CN | 105164808 A | 12/2015 |
| CN | 105027285 B | 6/2017 |
| CN | 107256867 A | 10/2017 |
| CN | ZL 201480024450.2 | 5/2018 |
| CN | 108461500 A | 8/2018 |
| EP | 2973710 A1 | 1/2016 |
| JP | 2006352104 A | 12/2006 |
| JP | 2007005814 A | 1/2007 |
| JP | 2007294595 A | 11/2007 |
| JP | 2008092708 A | 4/2008 |
| JP | 2008192708 A | 8/2008 |
| JP | 2009158529 A | 7/2009 |
| JP | 2009295617 A | 12/2009 |
| JP | 2011023586 A | 2/2011 |
| JP | 2012094694 A | 5/2012 |
| JP | 2012119445 A | 6/2012 |
| JP | 2012146773 A | 8/2012 |
| JP | 2012227326 A | 11/2012 |
| JP | 2013153382 A | 8/2013 |
| JP | 2013201396 A | 10/2013 |
| JP | 2013219239 A | 10/2013 |
| JP | 2016514371 A | 5/2016 |
| JP | 5965091 B2 | 8/2016 |
| JP | 6434424 B2 | 11/2018 |
| KR | 1020100104908 A | 9/2010 |
| KR | 1020110130916 A | 12/2011 |
| KR | 1020120101818 A | 9/2012 |
| KR | 1020130024303 A | 3/2013 |
| KR | 10-1764626 | 7/2017 |
| KR | 10-1821943 | 1/2018 |
| TW | 201236112 A | 9/2012 |
| TW | 201442211 A | 11/2014 |
| TW | 201507168 A | 2/2015 |
| TW | 201526207 A | 7/2015 |
| TW | I548065 B | 9/2016 |
| TW | I575716 | 3/2017 |
| TW | 201737472 A | 10/2017 |
| TW | 201826547 A | 7/2018 |
| WO | WO-2006132158 A1 | 12/2006 |
| WO | WO-2012009140 A2 | 1/2012 |
| WO | WO-2014116864 A1 | 7/2014 |
| WO | WO-2014149740 A1 | 9/2014 |
| WO | WO-2015066447 A1 | 5/2015 |
| WO | WO-2015066463 A1 | 5/2015 |

OTHER PUBLICATIONS

U.S. Appl. No. 14/069,553, Restriction Requirement dated Feb. 10, 2015, 10 pgs.
U.S. Appl. No. 14/069,553, Response filed Apr. 10, 2015 to Restriction Requirement dated Feb. 10, 2015, 6 pgs.
U.S. Appl. No. 14/069,553, Non Final Office Action dated Jul. 13, 2015, 16 pgs.
U.S. Appl. No. 14/069,553, Response filed Aug. 12, 2015 to Non Final Office Action dated Jul. 13, 2015, 8 pgs.
U.S. Appl. No. 14/069,553, Final Office Action dated Oct. 5, 2015, 17 pgs.
U.S. Appl. No. 14/069,553, Response filed Feb. 5, 2016 to Final Office Action dated Oct. 5, 2015, 9 pgs.
U.S. Appl. No. 14/069,553, Advisory Action dated Feb. 22, 2016, 5 pgs.
U.S. Appl. No. 14/069,553, Notice of Allowance dated May 4, 2016, 9 pgs.
U.S. Appl. No. 14/069,574, Restriction Requirement dated Feb. 5, 2015, 10 pgs.
U.S. Appl. No. 14/069,574, Response filed Apr. 6, 2015 to Restriction Requirement dated Feb. 5, 2015.
U.S. Appl. No. 14/069,574, Non Final Office Action dated Jul. 15, 2015, 15 pgs.
U.S. Appl. No. 14/069,574, Response filed Oct. 15, 2015 to Non Final Office Action dated Jul. 15, 2015, 7 pgs.
U.S. Appl. No. 14/069,574, Final Office Action dated Oct. 29, 2015, 16 pgs.
U.S. Appl. No. 14/069,574, Response filed Jan. 29, 2016 to Final Office Action dated Oct. 29, 2015, 9 pgs.
U.S. Appl. No. 14/069,574, Advisory Action dated Feb. 10, 2016, 4 pgs.
U.S. Appl. No. 14/069,574, Notice of Allowance dated Apr. 27, 2016, 9 pgs.
U.S. Appl. No. 14/069,553 U.S. Pat. No. 9,437,604, filed Nov. 1, 2013, Methods and Apparatuses Having Strings of Memory Cells Including a Metal Source.
U.S. Appl. No. 14/069,574 U.S. Pat. No. 9,431,410, filed Nov. 1, 2013, Methods and Apparatuses Having Memory Cells Including a Monolithic Semiconductor Channel.
U.S. Appl. No. 15/221,131, filed Jul. 27, 2016, Methods and Apparatuses Having Memory Cells Including a Monolithic Semiconductor Channel.
"European Application Serial No. 14857452.8, Extended European Search Report dated Jun. 7, 2017", 7 pgs.
"International Application Serial No. PCT/US2014/063377, International Preliminary Report on Patentability dated May 12, 2016", 8 pgs.
"International Application Serial No. PCT/US2014/063407, International Preliminary Report on Patentability dated May 12, 2016", 12 pgs.
"Japanese Application Serial No. 2016-526281, Office Action dated Mar. 28, 2017", w/ English Translation, 10 pgs.
"Japanese Application Serial No. 2016-526281, Response filed Jun. 27, 2017 to Office Action dated Mar. 28, 2017", W/ English Claims, 16 pgs.
"Korean Application Serial No. 10-2016-7014682, Office Action dated Jul. 31, 2017", With English Translation, 16 pgs.
"International Application Serial No. PCT/US2014/063377, International Search Report dated Jan. 23, 2015", 3 pgs.
"International Application Serial No. PCT/US2014/063377, Written Opinion dated Jan. 23, 2015", 6 pgs.
"International Application Serial No. PCT/US2014/063407, International Search Report dated Jan. 29, 2015", 3 pgs.
"International Application Serial No. PCT/US2014/063407, Written Opinion dated Jan. 29, 2015", 10 pgs.
"Chinese Application Serial No. 201480013075.1, Office Action dated Sep. 19, 2016", w/English Translation, 10 pgs.
"Chinese Application Serial No. 201480013075.1, Response filed Feb. 3, 2017 to Office Action dated Sep. 19, 2016", w/English Claims, 30 pgs.
"Chinese Application Serial No. 201480024450.2, Office Action dated May 3, 2017", With English Translation, 22 pgs.
"Chinese Application Serial No. 201480024450.2, Response filed Sep. 18, 2017 to Office Action dated May 3, 2017", w/English Claims, 18 pgs.
"Chinese Application Serial No. 201480063209.0, Office Action dated Feb. 2, 2019", W/English Translation, 13 pgs.
"Chinese Application Serial No. 201480063209.0, Office Action dated Aug. 23, 2019", w/English Translation, 16 pgs.
"Chinese Application Serial No. 201480063209.0, Response filed Jun. 14, 2019 to Office Action dated Feb. 2, 2019", w/ English Claims, 21 pgs.
"Chinese Application Serial No. 201480063209.0, Response filed Oct. 4, 2018 to Office Action dated Mar. 2, 2018", w/ English Claims, 24 pgs.
"Chinese Application Serial No. 201480063209.0, Response filed Nov. 4, 2019 to Office Action dated Aug. 23, 2019", w/ English Claims, 18 pgs.
"European Application Serial No. 14743125.8, Communication Pursuant to Article 94(3) EPC dated May 22, 2017", 6 pgs.
"European Application Serial No. 14743125.8, Extended European Search Report dated Jun. 21, 2016", 8 pgs.
"European Application Serial No. 14743125.8, Preliminary Amendment filed Mar. 9, 2016", 13 pgs.

(56) References Cited

OTHER PUBLICATIONS

"European Application Serial No. 14743125.8, Response filed Dec. 1, 2017 to Communication Pursuant to Article 94(3) EPC dated May 22, 2017", 11 pgs.
"European Application Serial No. 14770149.4, Extended European Search Report dated Nov. 25, 2016", 9 pgs.
"European Application Serial No. 14770149.4, Invitation Pursuant To Rule 62a(1) EPC dated Aug. 30, 2016", 2 pgs.
"European Application Serial No. 14770149.4, Preliminary Amendment filed Apr. 28, 2016", 22 pgs.
"European Application Serial No. 14857452.8, Communication Pursuant to Article 94(3) EPC dated Nov. 13, 2018", 5 pgs.
"European Application Serial No. 14857452.8, Response filed May 23, 2019 to Communication Pursuant to Article 94(3) EPC dated Nov. 13, 2018", w/ English Claims, 29 pgs.
"International Application Serial No. PCT/US2014/012798, International Preliminary Report on Patentability dated Aug. 6, 2015", 13 pgs.
"International Application Serial No. PCT/US2014/012798, International Search Report dated May 19, 2014", 3 pgs.
"International Application Serial No. PCT/US2014/012798, Written Opinion dated May 19, 2014", 11 pgs.
"International Application Serial No. PCT/US2014/020658, International Preliminary Report on Patentability dated Sep. 24, 2015", 6 pgs.
"International Application Serial No. PCT/US2014/020658, International Search Report dated Jun. 26, 2014", 3 pgs.
"International Application Serial No. PCT/US2014/020658, Written Opinion dated Jun. 26, 2014", 4 pgs.
"Japanese Application Serial No. 2015-555280, Office Action dated Feb. 27, 2018", w/English Translation, 31 pgs.
"Japanese Application Serial No. 2015-555280, Office Action dated Jul. 4, 2017", w/English Translation, 27 pgs.
"Japanese Application Serial No. 2015-555280, Response filed May 25, 2018 to Office Action dated Feb. 27, 2018", W/ English Claims, 22 pgs.
"Japanese Application Serial No. 2015-555280, Response filed Oct. 12, 2017 to Office Action dated Jul. 4, 2017", w/English Claims, 17 pgs.
"Japanese Application Serial No. 2016-500651, Notice of Rejection dated Mar. 1, 2016", W/English Translation, 4 pgs.
"Japanese Application Serial No. 2016-500651, Response filed May 20, 2016 to Notice of Rejection dated Mar. 1, 2016", W/ English Claims, 6 pgs.
"Korean Application Serial No. 10-2015-7029545, Final Office Action dated Mar. 27, 2017", w/English Translation, 6 pgs.
"Korean Application Serial No. 10-2015-7029545, Office Action dated Oct. 18, 2016", (With English Translation), 13 pgs.
"Korean Application Serial No. 10-2015-7029545, Response filed Apr. 25, 2017 to Final Office Action dated Mar. 27, 2017", W/English Claims, 14 pgs.
"Korean Application Serial No. 10-2015-7029545, Response filed Dec. 18, 2016 to Office Action dated Oct. 18, 2016", w/English Claims, 19 pgs.
"Korean Application Serial No. 10-2017-7021238, Office Action dated Aug. 16, 2017", w/English Translation, 5 pgs.
"Korean Application Serial No. 10-2017-7021238, Response filed Oct. 16, 2017 to Office Action dated Aug. 16, 2017", w/English Claims, 12 pgs.

"Protrusion", Merriam-Webster Dictionary, 2 pgs.
"Taiwanese Application Serial No. 103102815, Amendment filed Nov. 10, 2014", W/ English Claims, 52 pgs.
"Taiwanese Application Serial No. 103109314, Office Action dated Apr. 6, 2017", w/ English Translation, 23 pgs.
"Taiwanese Application Serial No. 103109314, Response filed Oct. 3, 2017 to Office Action dated Apr. 6, 2017", w/English Translation, 41 pgs.
"Taiwanese Application Serial No. 104110136, Office Action dated Jan. 26, 2016", W/English Translation, 3 pgs.
"Taiwanese Application Serial No. 104110136, Response filed Apr. 28, 2016 to Office Action dated Jan. 26, 2016", W/ English Claims, 7 pgs.
"Taiwanese Application Serial No. 107111763, First Office Action dated Jul. 2, 2018", w/English translation, 6 pgs.
"Taiwanese Application Serial No. 107111763, Response filed Oct. 3, 2018 to First Office Action dated Jul. 2, 2018", w/ English claims, 52 pgs.
Hang-Ting, Lue, et al., "A Novel Planar Floating-Gate (EG) / Charge Trapping (CT) NAND Device Using BE-SONOS Inter-Poly Dielectric (IPD)", In proceeding of: Electron Devices Meeting (IEDM), (2009), 34.3:1-4.
Kitamura, Takuya, et al., "A Low Voltage Operating Flash Memory Cell with High Coupling Ratio", (1998), 2 pgs.
Kuppurao, Satheesh, et al., "EQuipment Frontiers: Thermal Processing: In situ steam generation: A new rapid thermal oxidation technique", Solid State Technology, (Jul. 2000), Cover, Index, 233-239.
Seo, Moon-Sik, et al., "The 3 dimensional Vertical FG NAND Flash Memory Cell Arrays with the Novel Electrical S/D/ Technique using the Extending Sidewall Contral Gate (ESCG)", 4 pages.
"Chinese Application Serial No. 201480063209.0, Decision of Rejection dated Oct. 9, 2020", w/o English translation, 5 pgs.
"Chinese Application Serial No. 201480063209.0, Office Action dated May 29, 2020", w/English Translation, 17 pgs.
"Chinese Application Serial No. 201480063209.0, Response filed Aug. 11, 2020 to Office Action dated May 29, 2020", w/ English Claims, 20 pgs.
"Chinese Application Serial No. 201480063209.0, Response filed Jan. 22, 2021 to Decision of Rejection dated Oct. 9, 2020", w English Claims, 10 pgs.
"Chinese Application Serial No. 201480063209.0, Notice of Reexamination dated Jun. 29, 2021", w English translation, 11 pgs.
"Chinese Application Serial No. 201480063209.0, Notice of Reexamination dated Oct. 18, 2021", w o English translation, 14 pgs.
"Chinese Application Serial No. 201480063209.0, Response filed Dec. 2, 2021 to Notice of Reexamination dated Oct. 18, 2021" w/English Claims, 9 pgs.
"Chinese Application Serial No. 201480063209.0, Office Action dated Mar. 2, 2018", w/English Translation, 18 pgs.
"Japanese Application Serial No. 2016-526281, Office Action dated Sep. 26, 2017", With English Translation, 6 pgs.
"Japanese Application Serial No. 2016-526281, Response filed Dec. 25, 2017 to Office Action dated Sep. 26, 2017", w/ Amended Claims, 18 pgs.
"Korean Application Serial No. 10-2016-7014682, Response filed Dec. 28, 2017 to Office Action dated Jul. 31, 2017", w/ Amended Claims, 25 pgs.

\* cited by examiner

METHODS AND APPARATUSES HAVING STRINGS OF MEMORY CELLS INCLUDING A METAL SOURCE

PRIORITY APPLICATION

This application is a divisional of U.S. application Ser. No. 14/069,553, filed Nov. 1, 2013, which is incorporated herein by reference in its entirety.

STATEMENT OF JOINT RESEARCH AGREEMENT

In compliance with 37 C.F.R. § 1.71(g) (1), the inventions described and claimed herein were made pursuant to a Joint Research Agreement as set forth in 35 U.S.C. § 102(c), and as defined in 35 §100(h) that was in effect on or before the date such inventions were made, and as a result of activities undertaken within the scope of the Joint Research Agreement, by or on the behalf of Micron Technology, Inc. and Intel Corporation.

TECHNICAL FIELD

The present embodiments relate generally to memory and metal sources in memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile (e.g., flash) memory.

Flash memory devices typically use a one-transistor memory cell that may allow for high memory densities, high reliability, and low power consumption. Changes in threshold voltage of the memory cells, through programming of a charge storage structure such as floating gates, trapping layers or other physical phenomena, may determine the data state of each cell.

The memory cells may be arranged in strings of memory cells where each string may be coupled to a source. Groups of strings of memory cells (e.g., memory blocks) may all be coupled to a common source.

When a memory manufacturer desires to increase a memory density of a memory device, additional groups of strings of memory cells may be added to the memory device and coupled to the common source. Thus, the common source may be increased in length, thereby increasing its resistance.

It may be desirable to keep the resistance of the source as low as possible since, as is known in the art, a larger resistance may cause a larger voltage drop from a particular point of the circuit to the common source. A larger voltage drop can cause problems during memory operations that rely on very small voltage differences.

DETAILED DESCRIPTION

Figure 1:
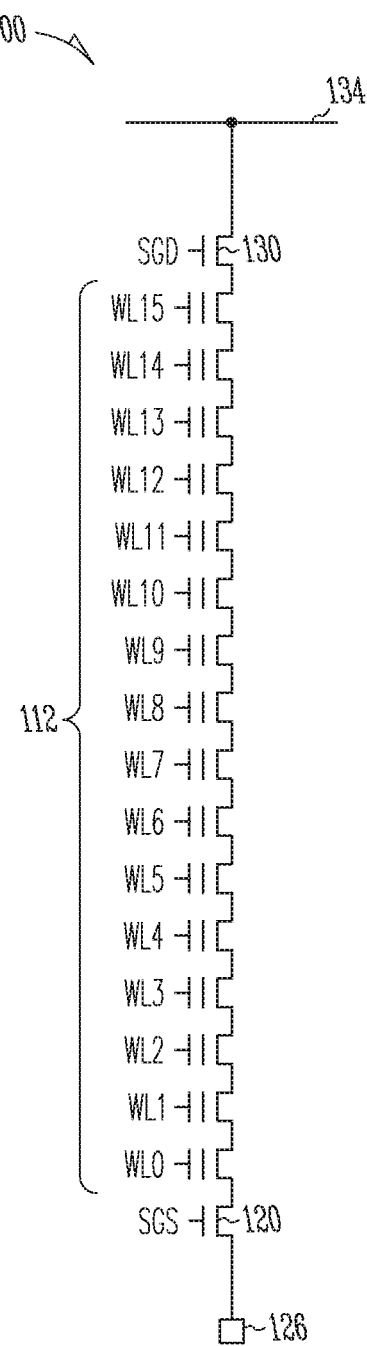
FIG. 1 illustrates a schematic diagram of an embodiment of a string of memory cells.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic diagram of a string 100 of memory cells. For purposes of illustration only, the string 100 is shown having 16 memory cells 112.

Alternate embodiments can include more or less than 16 memory cells 112. The string 100 can include a source select gate transistor 120 that may include an n-channel transistor coupled between one of the memory cells 112 at one end of the string 100 and a common source 126. The common source 126 may comprise, for example, a slot of commonly doped semiconductor material and/or other conductive material. At the other end of the string 100, a drain select gate transistor 130 may include an n-channel transistor coupled between one of the memory cells 112 and a data line (e.g., bit line) 134.

Each of the memory cells 112 may comprise, for example, a floating gate transistor or, alternatively, a charge trap transistor and may include a single level charge storage device or a multilevel charge storage device. The memory cells 112, the source select gate transistor 120, and the drain select gate transistor 130 are controlled by signals on their respective control gates, the signals being provided on access lines (e.g., word lines) WL0-WL15. In one embodiment, the control gates of memory cells in a row of memory cells can form part of an access line.

The source select gate transistor 120 receives a control signal that controls the source select gate transistor 120 to substantially control conduction between the string 100 and the common source 126. The drain select gate transistor 130 receives a control signal that controls the drain select gate transistor 130, so that the drain select gate transistor 130 can be used to select or deselect the string 100.

The string 100 can be one of multiple strings of memory cells 112 in a block of memory cells in a memory device, such as a NAND-architecture flash memory device. Each string 100 of memory cells 112 may be formed vertically such that they extend outward from a substrate as opposed to a planar manner along the substrate.

Figure 2:
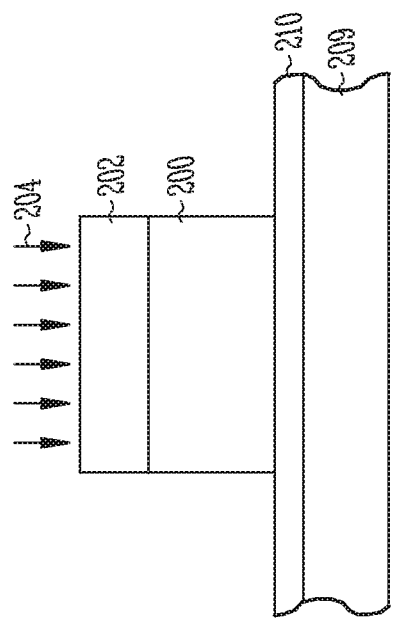

FIG. 2 illustrates embodiments of fabrication steps for forming a vertical string of memory cells. A source material 200 (e.g., metal silicide) may be formed over a substrate 209 (e.g., silicon) to act as a metal source material. An oxide or polysilicon material 210 may be formed between the substrate 209 and the source material 200.

The source material 200 may include tungsten silicide ($WSi_x$) or some other type of high temperature refractory metal silicides. For example, the metal silicide may include one of: tungsten silicide ($WSi_x$), tantalum silicide ($TaSi_x$), or molybdenum silicide ($MoSi_x$). A metal silicide may work better as a doped source metal since metal silicide may take doping better than a pure metal material. The silicide can be deposited by physical vapor deposition (PVD), wet deposition (WD), or an evaporation process. "x" ratio range can be 1.0 to 4.0.

A capping material 202 may be formed over the source material 200. The capping material 202 may include an oxide material (e.g., an oxide of silicon), a polysilicon material, or some other capping material for sealing pores in the source material 200. If the capping material 202 is an oxide (e.g., an oxide of silicon), the oxide may be used as a source select gate oxide for a source select gate transistor, such as the source select gate transistor 120 as illustrated in FIG. 1.

The source material 200 in FIG. 2 can be doped in a doping process 204 (e.g., an implantation process) in order to alter its electrical properties as desired. For example, arsenic or phosphorus may be used in doping process 204 to dope the metal material to create an n-type conductive material. Boron or gallium may be used in doping process 204 to dope the source material 200 to create a p-type conductive material.

Figure 3:
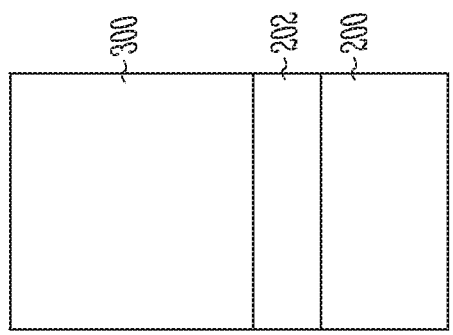
FIGS. 2-10 illustrate embodiments of fabrication steps for forming vertical strings of memory cells.

FIG. 3 illustrates an embodiment of another fabrication step for forming a vertical string of memory cells. A polysilicon material 300 may be formed over the capping material 202. In an embodiment, the polysilicon material 300 may be used as a gate of a source select gate transistor, such as source select gate transistor 120 as illustrated in FIG. 1.

Figure 4:
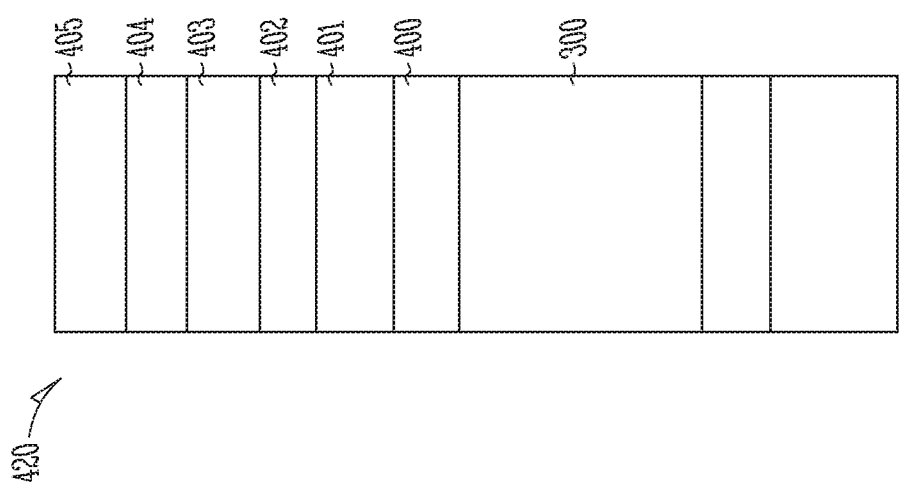

FIG. 4 illustrates an embodiment of a series of fabrication steps for forming a vertical string of memory cells. An etch stop material 400 may be formed over the polysilicon material 300. In an embodiment, the etch stop material 400 may include a metal oxide such as aluminum oxide ($Al_2O_3$).

Levels of control gate material 401, 403 may be formed over the etch stop material 400 with alternating levels of insulator material 402, 404. For example, the levels of control gate material 401, 403 may include a polysilicon material and the levels of insulator material 402, 404 may include an oxide material. The levels of control gate material 401, 403 may be used as the control gates of the vertically formed memory cells. The levels of insulator material 402, 404 may be used between the memory cells to isolate adjacent memory cells from each other.

An etch mask 405 may be formed over the top of the vertical stack 420. In an embodiment, the etch mask 405 may include a nitride hard mask.

Figure 5:
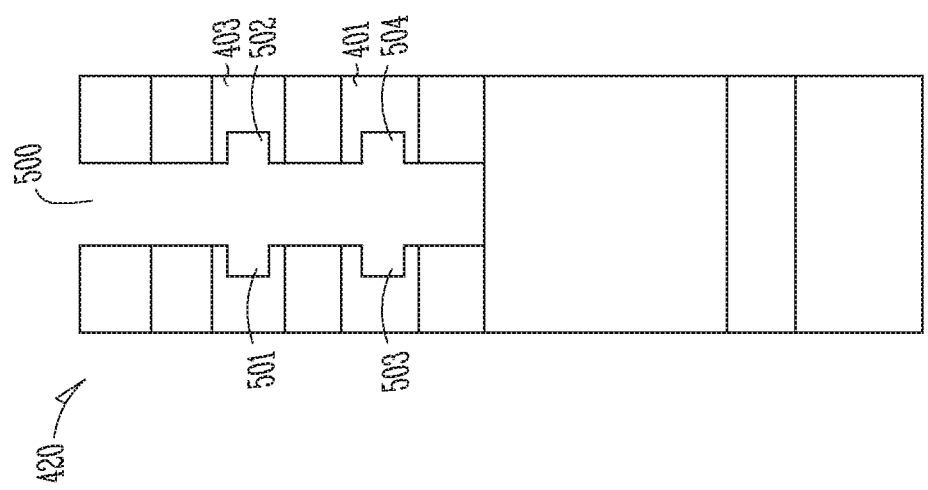

FIG. 5 illustrates an embodiment of a series of additional fabrication steps for forming a vertical string of memory cells. An etching step may be used to form an opening 500, such as a contact hole or a trench, in the vertical stack 420 down through the etch stop material 400. A directional etch process may be used to form recesses 501-504 into the levels of control gate material 401, 403 on both sides of the walls of the opening.

Figure 6:
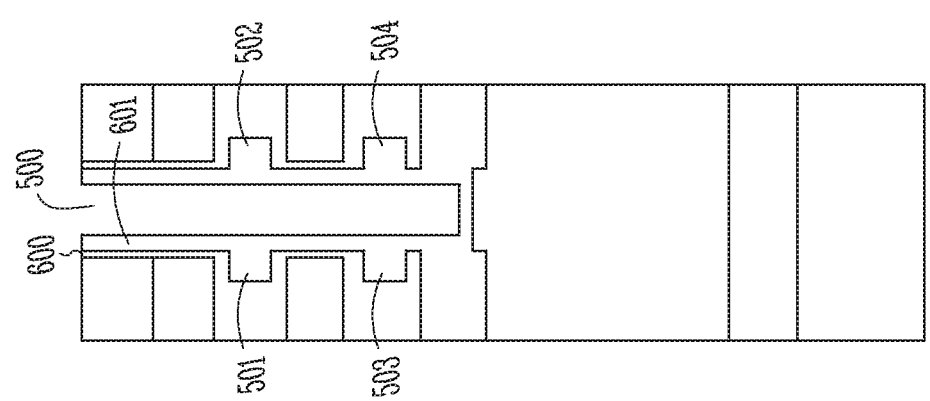

FIG. 6 illustrates an embodiment of a series of additional fabrication steps for forming a vertical string of memory cells. A dielectric material (e.g., oxide-nitride-oxide (ONO)) 600 may be formed along the interior walls of the opening 500. The ONO material 600 may also line the walls of the recesses 501-504. In an embodiment, the ONO material 600 may be used as a dielectric material for the string of memory cells.

A polysilicon material 601 may be formed (e.g., deposited) over the ONO material 600 along the sidewalls of the opening 500. The polysilicon material 601 may also fill the recesses 501-504. In an embodiment, the polysilicon material 601 may be used as the charge storage structures (e.g., floating gates) for each memory cell in the string of memory cells.

Figure 7:
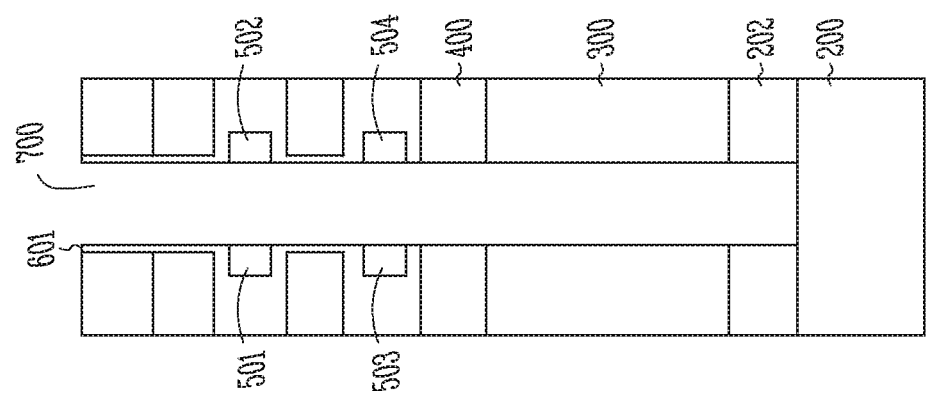

As shown in FIG. 7, a post polysilicon etch process may be used to remove part of polysilicon 601 along the sidewalls and to form an opening (e.g., a trench or contact hole) 700 through the previously formed materials 202, 300, 400. The opening 700 may be formed down to the source material 200. After a portion of the polysilicon material 601 lining the sidewalls of the opening 700 is removed, a remaining portion of the polysilicon material 601 that fills the recesses 501-504 may act as the charge storage structures (e.g., floating gates) of the memory cells. Since etching through so much material 202, 300, 400 may use a powerful etching process, the metal material 200 may act as a better etch stop material than a polysilicon material.

Figure 8:
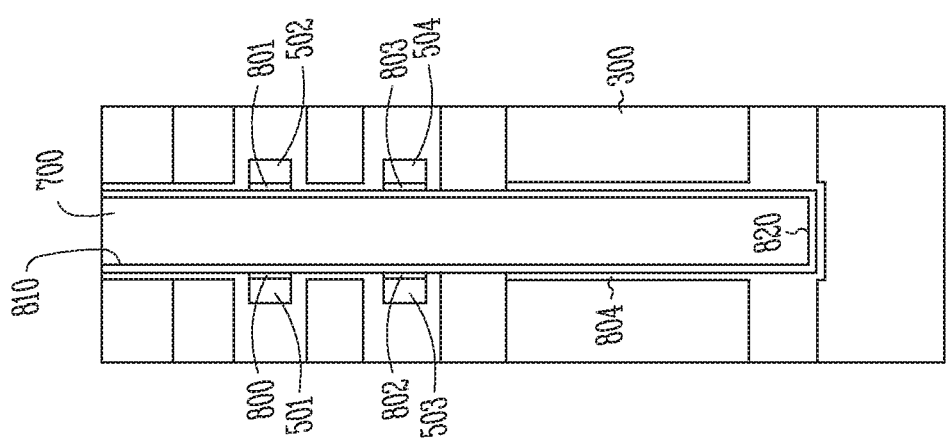

FIG. 8 illustrates an embodiment of a series of additional fabrication steps for forming a vertical string of memory cells. An oxide 800-804 may be formed (e.g., grown) along areas of the opening 700. For example, an oxide 800-803 may be formed over each polysilicon material in each recess 501-504. In an embodiment, this oxide 800-803 may act as a tunnel dielectric between the charge storage structure and the channel material to be formed subsequently (e.g., formed after oxide 800-804 are formed).

An oxide 804 may be formed (e.g., grown) along the sidewalls and bottom 820 of a bottom portion of the opening 700. In an embodiment, this oxide 804 may act as a dielectric for the polysilicon material 300 of the source select gate.

A polysilicon liner 810 may be formed along the sidewalls and bottom 820 of the opening 700. The polysilicon liner 810 may be formed over the previously formed oxide 800-804 (e.g., formed after oxide 800-804 are formed).

Figure 9:
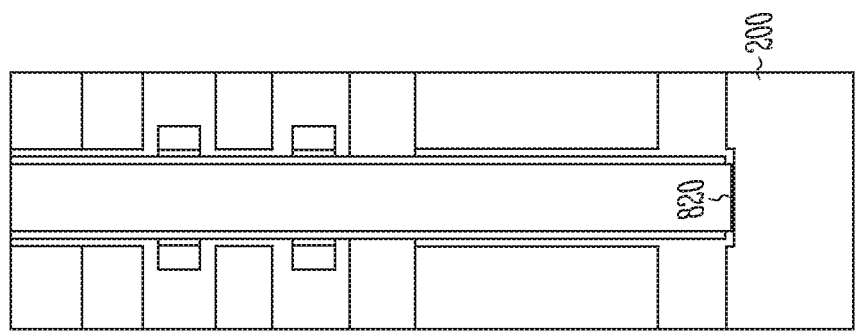

FIG. 9 illustrates an embodiment of another fabrication step for forming a vertical string of memory cells. A directional etch process may be used to remove a portion of the polysilicon liner 810 and a portion of oxide 804 formed at the bottom 820 of the opening 700. This step may give the subsequently formed channel material an ohmic contact with the source material 200.

Figure 10:
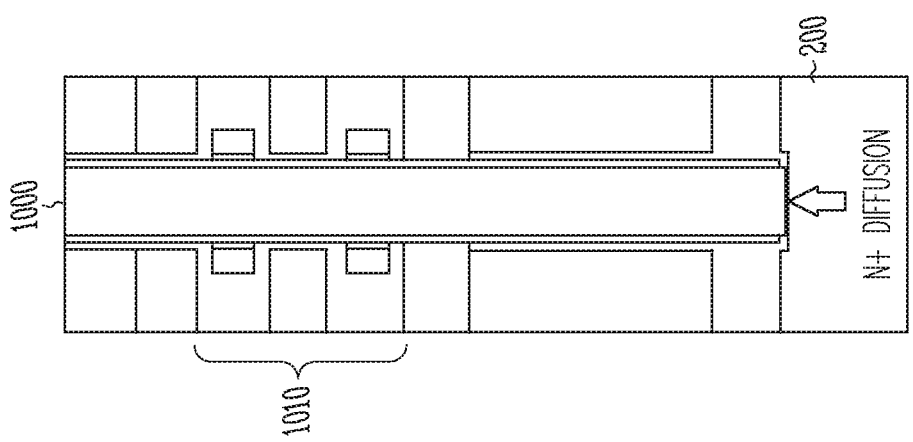

FIG. 10 illustrates an embodiment of another fabrication step for forming a vertical string of memory cells. A semiconductor material (e.g., polysilicon) 1000 may be used to fill the opening. In an embodiment, the semiconductor material 1000 may be used as a channel during operation of the vertical string of memory cells 1010 formed in the opening. In an embodiment, the ohmic contact of the semiconductor material 1000 to the source material 200 enables diffusion (e.g., N+ diffusion) to occur from the source material 200 to the channel (e.g., semiconductor material 1000) during operation.

Figure 11:
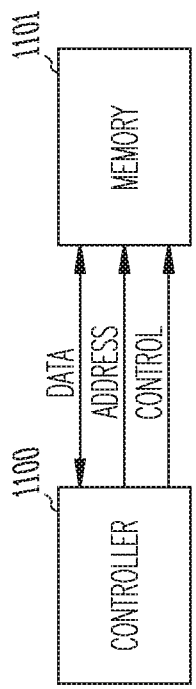
FIG. 11 illustrates a block diagram of an embodiment of a system.

FIG. 11 illustrates an embodiment of a system that may use the vertically formed strings of memory cells of FIGS. 1-10. A controller 1100 may be used to control operations of the system. A memory 1101, coupled to the controller 1100, may include the vertically formed strings of memory cells. In an embodiment, the controller 1100 may be coupled to the memory 1101 over control, data, and address buses. In another embodiment, the address and data buses may share a common I/O bus.

An apparatus may be defined as circuitry, an integrated circuit die, a device, or a system.

CONCLUSION

One or more embodiments can provide a doped metal silicide source. The doped metal silicide source may provide lower sheet resistance than a polysilicon source and also provide adequate gate induced drain leakage performance. A vertical string of memory cells may be formed over the doped metal silicide source and a semiconductor material formed vertically adjacent to the vertical string of memory cells. The semiconductor material may be in contact with the doped metal silicide source to enable diffusion from the source to the semiconductor material that acts as a channel for the string of memory cells.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. An apparatus comprising:
 a plurality of alternating levels of control gate material and insulator material;
  a vertical string of memory cells formed in the plurality of alternating levels of control gate material and insulator material, the vertical string of memory cells including a semiconductor channel material comprising polysilicon forming a pillar extending vertically through the plurality of alternating levels of control gate material and insulator material, the semiconductor channel material forming a channel for the memory cells of the vertical string of memory cells;
 a doped metal silicide common source formed over a substrate and extending between the vertical string of memory cells and the substrate, the doped metal silicide common source in ohmic contact with the polysilicon-comprising semiconductor channel material, wherein dopant from the doped metal silicide common source is diffused into the vertically extending semiconductor channel material, extending upwardly from the doped metal silicide common source;
 a capping layer over the doped metal silicide common source, wherein the polysilicon-comprising semiconductor channel material of each vertical string of memory cells extends through a respective opening extending through the plurality of alternating levels of control gate material and insulator material, and through the capping material, to the doped metal silicide common source; and
 a material extending between the doped metal silicide common source and the substrate;
 wherein memory cells of the vertical string of memory cells are at least partially formed in a respective lateral recess in a level of the control gate material, in which the control gate material is laterally recessed relative to adjacent levels of insulator material, and wherein the memory cells of the vertical string of memory cells comprise:
  a dielectric material in the lateral recess adjacent to the control gate material;
  a charge storage structure within the lateral recess and adjacent to the dielectric material; and
  a tunnel dielectric material between the charge storage structure and the vertically extending, polysilicon-comprising semiconductor channel material.

2. The apparatus of claim 1, wherein the dielectric material comprises an oxide-nitride-oxide material.

3. The apparatus of claim 1, wherein the doped metal silicide source comprises an N+ doped metal silicide.

4. The apparatus of claim 3, wherein the doped metal silicide source is doped with arsenic or phosphorus.

5. The apparatus of claim 1, further comprising a select gate material and insulator material adjacent to the semiconductor material and between a lowest level of control gate material and the doped metal silicide source.

6. The apparatus of claim 1, wherein the doped metal silicide source comprises tungsten silicide.

7. The apparatus of claim 1, wherein the doped metal silicide source comprises a P+ doped metal silicide.

8. The apparatus of claim 7, wherein the doped metal silicide source is doped with boron or gallium.

9. The apparatus of claim 1, wherein the semiconductor material further comprises a polysilicon liner adjacent the select gate material, and wherein the polysilicon-containing semiconductor channel material extends within the polysilicon liner.

10. The apparatus of claim 1, wherein the doped metal silicide source comprises a refractory metal silicide.

11. The apparatus of claim 1, wherein the refractory metal silicide comprises tantalum silicide or molybdenum silicide.

12. A memory structure, comprising:
 a doped metal silicide common source formed over a substrate, a material layer between the doped metal silicide common source and the substrate;
 a capping material over the doped metal silicide common source;
 multiple vertical strings of memory cells extending above the doped metal silicide common
  source, each vertical string of memory cells respectively including,
  multiple vertically-arranged charge storage transistors, and
  a vertically extending pillar of semiconductor channel material forming a channel of the multiple charge storage transistors in the string;
 wherein each of the vertically extending channel materials of respective strings of the multiple strings of memory cells extends upwardly from an ohmic contact with the doped metal silicide common source, and through an opening in the capping material, to the vertically-arranged charge storage transistors of the respective string, wherein the pillar is in selective communication with a respective bit line, and
 wherein a dopant of the doped metal silicide common source is diffused into the vertically extending channel materials of each of the multiple vertical strings.

13. The memory structure of claim 12, wherein the doped metal silicide source comprises a refractory metal silicide.

14. The memory structure of claim 13, wherein the refractory metal silicide at least one of tungsten silicide, tantalum silicide, or know what molybdenum silicide.

15. The memory structure of claim 12, wherein the doped metal silicide contains a N+ dopant.

16. A memory structure, comprising:
 an N+ doped refractory metal silicide common source over a substrate;
 a polysilicon or oxide material separating the N+ doped refractory metal silicide common source and the substrate;
 multiple vertical strings of memory cells extending above the N+ doped refractory metal silicide common source, each string of the multiple vertical strings including,
 multiple vertically-arranged charge storage transistors, each charge storage transistor having a respective control gate,
 a respective vertically-extending pillar comprising polysilicon forming a channel for the charge storage transistors of the string, and tunnel dielectric material between the vertically-extending channel material and each charge storage transistor of the vertical string; and wherein the vertically extending polysilicon pillar of each of the channels of the respective multiple vertical strings extends vertically from an ohmic contact with the N+ doped refractory metal silicide common source upwardly and adjacent the multiple vertically-arranged charge storage transistors of the respective string; and wherein N+ dopant from the N+ doped refractory metal silicide common source is diffused into the polysilicon of the vertically extending channel material as a result of the ohmic contact.

\* \* \* \* \*